United States Patent
Zhong et al.

(10) Patent No.: US 8,044,477 B1
(45) Date of Patent: Oct. 25, 2011

(54) PHOTOVOLTAIC DEVICE AND METHOD FOR MAKING

(75) Inventors: Dalong Zhong, Niskayuna, NY (US); Gautam Parthasarathy, Niskayuna, NY (US); Richard Arthur Nardi, Jr., Scotia, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/894,242

(22) Filed: Sep. 30, 2010

(51) Int. Cl.
*H01L 31/102* (2006.01)
*H01L 21/00* (2006.01)

(52) U.S. Cl. ........................................ 257/442; 136/260

(58) Field of Classification Search .................. 257/439, 257/442; 438/19, 795; 136/260, 264
See application file for complete search history.

(56) References Cited

U.S. PATENT DOCUMENTS

| | | | |
|---|---|---|---|
| 3,418,229 A | 12/1968 | Lakshmanan et al. | |
| 3,811,953 A | 5/1974 | Nozik | |
| 3,911,953 A | 10/1975 | Crombie et al. | |
| 4,207,119 A | 6/1980 | Tyan | |
| 4,297,189 A | 10/1981 | Smith, Jr. et al. | |
| 4,689,247 A | 8/1987 | Doty et al. | |
| 5,500,055 A | 3/1996 | Toyama et al. | |
| 5,578,502 A | 11/1996 | Albright et al. | |
| 6,548,751 B2 | 4/2003 | Pelkus, Jr. et al. | |
| 2005/0009228 A1 | 1/2005 | Wu et al. | |
| 2005/0274411 A1 | 12/2005 | King et al. | |
| 2006/0180200 A1 | 8/2006 | Platzer Bjorkman et al. | |
| 2009/0194165 A1 | 8/2009 | Murphy et al. | |
| 2009/0194166 A1 | 8/2009 | Powell et al. | |
| 2010/0184249 A1 * | 7/2010 | Chen .............................. 438/72 | |

OTHER PUBLICATIONS

Akhlesh Gupta, Karthikeya Allada, Sung Hyun Lee, Alvin D. Compaan; "Oxygenated CdS Window Layer for Sputtered CdS/CdTe Solar Cells", Mat. Res. Soc. Symp, Materials Research Society, 2003, vol. 763, 6 Pages.

Yong Zhang, X. Wu, R. Dhere, J. Zhou, Y. Yan, A. Mascarenhas; "Raman Studies of Nanocrystalline CdS: O Film", National Renewable Energy Laboratory U.S Department of Energy, Conference Paper, NREL/CP-590-37026., Jan. 2005, 3 Pages.

* cited by examiner

*Primary Examiner* — William D Coleman

(74) *Attorney, Agent, or Firm* — Paul J. DiConza

(57) ABSTRACT

One aspect of the present invention provides a device that includes a substrate; a first semiconducting layer; a transparent conductive layer; a transparent window layer. The transparent window layer includes cadmium sulfide and oxygen. The device has a fill factor of greater than about 0.65. Another aspect of the present invention provides a method of making the device.

20 Claims, 5 Drawing Sheets

PHOTOVOLTAIC DEVICE AND METHOD FOR MAKING

BACKGROUND

The invention relates generally to the field of photovoltaics. In particular, the invention relates to a method of making a layer used in a photovoltaic device and to a photovoltaic device made therefrom.

One of the main focuses in the field of photovoltaic devices is the improvement of energy conversion efficiency (from electromagnetic energy to electric energy or vice versa). Solar energy is abundant in many parts of the world year around. Unfortunately, the available solar energy is not generally used efficiently to produce electricity. Photovoltaic ("PV") devices convert light directly into electricity. Photovoltaic devices are used in numerous applications, from small energy conversion devices for calculators and watches to large energy conversion devices for households, utilities, and satellites.

Further, the cost of conventional photovoltaic cells or solar cell, and electricity generated by these cells, is generally comparatively high. For example, a typical solar cell achieves a conversion efficiency of less than 20 percent. Moreover, solar cells typically include multiple layers formed on a substrate, and thus solar cell manufacturing typically requires a significant number of processing steps. As a result, the high number of processing steps, layers, interfaces, and complexity increase the amount of time and money required to manufacture these solar cells.

Photovoltaic devices often suffer reduced performance due to loss of light, through for example, reflection and absorption. Therefore, research in optical designs of these devices includes light collection and trapping, spectrally matched absorption and up/down light energy conversion. One of the ways to minimize the loss in a photovoltaic cell is to incorporate a wide bandgap window layer. It is well known in the art that the design and engineering of window layers should have as high a bandgap as possible to minimize absorption losses. The window layer should also be materially compatible with the absorber layer so that the interface between the absorber layer and the window layer contains negligible interface defect states. Typically, cadmium sulfide (CdS) has been used to make the window layer in photovoltaic cells, e.g. cadmium telluride (CdTe) and copper indium gallium diselenide (CIGS) solar cells. One major drawback for cadmium sulfide is its relatively low bandgap which results in current loss in the device. A thin layer of cadmium sulfide is employed in photovoltaic devices to help reduce optical loss by absorption. However, issues such as shunts between the absorber layer and the transparent conductive oxide (TCO) exist in the photovoltaic devices due to the presence of the thin cadmium sulfide layer. To overcome the above disadvantage, a high resistive transparent buffer layer is employed to prevent the shunting. In addition, the processing conditions to make some photovoltaic devices, for example devices that include cadmium telluride, are harsh, and the layers are exposed to high temperatures, therefore thermal stability of the layers at the high temperatures is an important criterion.

Therefore, there remains a need for an improved solution to the long-standing problem of inefficient and complicated solar energy conversion devices and methods of manufacture.

BRIEF DESCRIPTION

One aspect of the present invention provides a device that includes a substrate; a first semiconducting layer; a transparent conductive layer; a transparent window layer. The transparent window layer includes cadmium sulfide and oxygen. The device has a fill factor of greater than about 0.65.

Another aspect of the present invention provides a device that includes a superstrate; a transparent conductive layer; a transparent window layer comprising cadmium sulfide and oxygen, and a first semiconducting layer comprising a telluride. The device has a fill factor of greater than about 0.65.

Yet another aspect of the present invention provides a device that includes a substrate; a first semiconducting layer comprising a selenide; a transparent window layer comprising cadmium sulfide and oxygen; and a transparent conductive layer. The device has a fill factor of greater than about 0.65.

In yet another aspect of the present invention provides a method to make a photovoltaic device. The method includes disposing a transparent conductive layer on a substrate; disposing a transparent window layer on the transparent conductive substrate; and disposing a first semiconducting layer adjacent to the transparent window layer. The step of disposing the transparent window layer includes providing a target comprising a semiconductor material within an environment comprising oxygen, applying a plurality of direct current pulses to the target to create a pulsed direct current plasma; sputtering the target with the pulsed direct current plasma to eject a material comprising cadmium and sulfur into the plasma; and depositing a film comprising the material onto a substrate. The target includes a semiconductor material comprising cadmium and sulfur.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
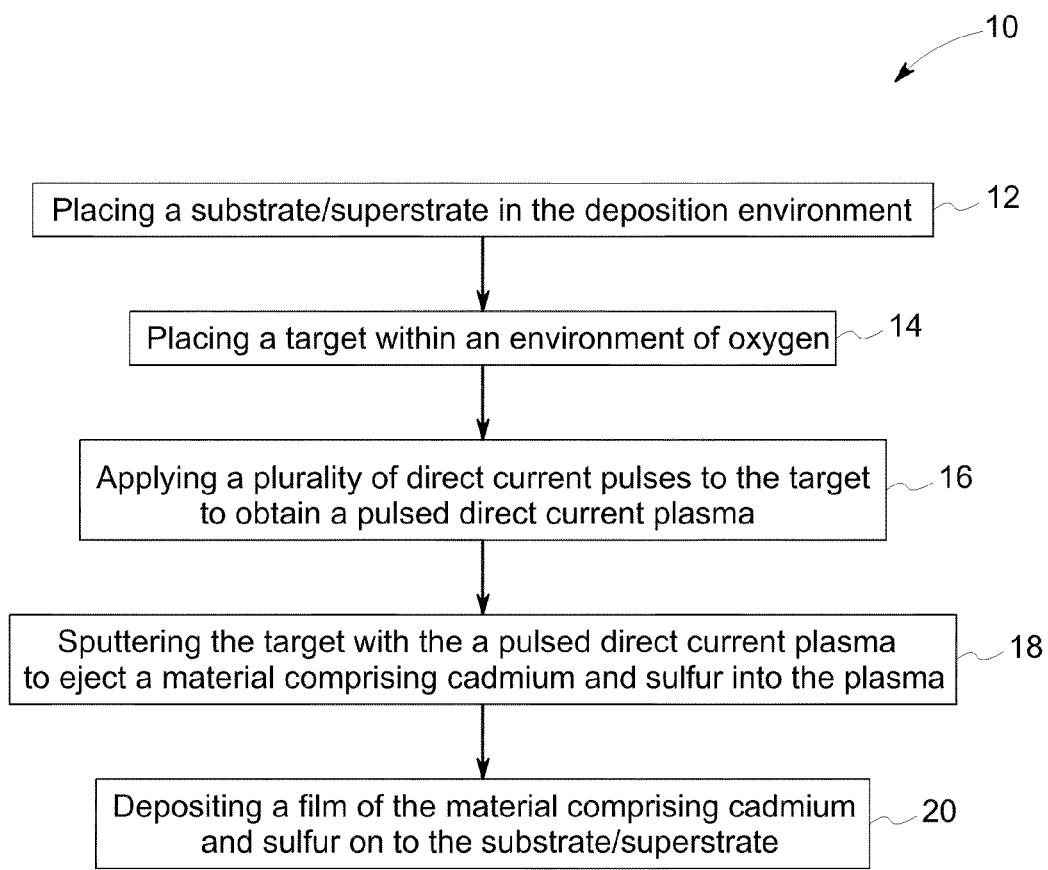
FIG. 1 illustrates a flow diagram of the method to make a film in accordance with an embodiment of the invention.

While only certain features of the invention have been illustrated and described herein, many modifications and changes will occur to those skilled in the art. It is, therefore, to be understood that the appended claims are intended to cover all such modifications and changes as fall within the true spirit of the invention. In the specification and claims, reference will be made to a number of terms, which have the following meanings.

The singular forms "a", "an" and "the" include plural referents unless the context clearly dictates otherwise. Approximating language, as used herein throughout the specification and claims, may be applied to modify any quantitative representation that could permissibly vary without resulting in a change in the basic function to which it is related. Accordingly, a value modified by a term such as "about" is not to be limited to the precise value specified. In some instances, the approximating language may correspond to the precision of an instrument for measuring the value. Similarly, "free" may be used in combination with a term, and may include an insubstantial number, or trace amounts, while still being considered free of the modified term.

As used herein, the terms "may" and "may be" indicate a possibility of an occurrence within a set of circumstances; a possession of a specified property, characteristic or function; and/or may qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances, an event or capacity can be expected, while in other circumstances, the event or capacity cannot occur—this distinction is captured by the terms "may" and "may be".

"Optional" or "optionally" means that the subsequently described event or circumstance may or may not occur, and that the description includes instances where the event occurs and instances where it does not. The terms "comprising", "including", and having are intended to be inclusive and mean that there may be additional elements other than the listed elements. Furthermore, whenever a particular feature of the invention is said to consist of at least one of a number of elements of a group and combinations thereof, it is understood that the feature may comprise or consist of any of the elements of the group, either individually or in combination with any of the other elements of that group.

It is also understood that terms such as "top," "bottom," "outward," "inward," and the like are words of convenience and are not to be construed as limiting terms. As used herein, the terms "disposed over", or "disposed between" refers to both secured or disposed directly in contact with and indirectly by having intervening layers therebetween.

As previously noted, one embodiment of the present invention is a method for making a film. The method includes providing a target comprising a semiconductor material within an environment comprising oxygen; applying a plurality of direct current pulses to the target to create a pulsed direct current plasma; sputtering the target with the pulsed direct current plasma to eject a material comprising cadmium and sulfur into the plasma; and depositing a film comprising the material onto a substrate.

FIG. 1 represents a flow diagram 10 of a method to make a film according to one embodiment of the present invention. Step 12 provides a substrate or a superstrate in a deposition environment, for example, a deposition chamber. In one embodiment the substrate or superstrate may include a glass, a polymer, a metal, or a composite. In another embodiment, the substrate may include a layer of a transparent conductive layer deposited on the substrate. In yet another embodiment, the substrate or superstrate may include the substrate or superstrate having multiple layers. These substrates or superstrates may be oriented and fixed within the deposition environment by methods known to one skilled in the art, for example the substrate may be fixed by means of a holder.

In step 14, a target is provided within an environment of oxygen. The target is a semiconductor material that includes cadmium and sulfur. The target includes the semiconductor material that is to be deposited on the substrate or the superstrate. In one embodiment, the target is any semiconductor material that includes compounds containing cadmium and sulfur that may have the required property for the deposition. In one embodiment, the target may also include zinc. In another embodiment, the target may further include zinc oxide. In yet another embodiment the target comprises an alloy of zinc cadmium sulfide represented by the formula $Zn_xCd_{1-x}S$, where x is a number in a range from about 0.01 to about 0.99. In one embodiment, the target may be placed at a predetermined distance from the substrate or superstrate.

In one embodiment, the target may be placed in an environment that has a predetermined ratio of oxygen and an inert gas. In one embodiment, the amount of oxygen in the environment may be varied and may be in a range from about 0.1 percent to 50 percent oxygen based either on the volume or by mass flow, to a predetermined level of the oxygen to inert gas mixture. Non-limiting examples of inert gas that may be used include argon, helium, nitrogen, and combination thereof. In one embodiment, the inert gas employed is argon. In one embodiment, the mixture of oxygen and inert gas may be combined and mixed prior to being introduced in the deposition environment. In another embodiment, the oxygen and inert gas may be introduced separately in the deposition environment where the mixing occurs. Typically, the partial pressure of the mixture of oxygen and inert gas inside the deposition environment is maintained in a range from about 0.1 Pascals to about 3 Pascals.

Step 16 involves applying a plurality of direct current pulses to the target to obtain a pulsed direct current plasma. As used herein the term "pulsed sputtering" is a physical vapor deposition method employing ion sputtering or magnetron sputtering of the target to produce a coating or a film on a surface. Examples of direct current pulses that may be applied to the target include a bipolar asymmetric pulsed direct current power, pulsing at a frequency of tens to hundreds of kilo Hertz (kHz). Typically one skilled in the art would appreciate that when the direct current pulses are applied to the target in an environment of oxygen and inert gas, ionization of the gases may also occur. In step 18, the target is sputtered with the pulsed direct current plasma to eject a material that includes cadmium and sulfur into the plasma, via the pulsed sputtering process. In one embodiment, the sputtering is carried out at a pressure in a range from about 0.1 Pascals to about 3 Pascals at an average power of about 500 watt. In another embodiment, the bipolar asymmetric pulsed direct current power is about 100 kilo-Hertz, reverse time in a range of about 3 microseconds to 4 microseconds, while the average power density is in the range from about 0.2 Watt per centimeter square to about 2 Watt per centimeter square. In one embodiment, the sputtering is carried out at a substrate temperature in a range from about 50 degrees Celsius to about 550 degrees Celsius, and in some embodiments at a substrate temperature from about 100 degrees Celsius to about 300 degrees Celsius. In another embodiment, the sputtering is carried out at ambient temperature. In one embodiment, the material that is ejected on sputtering from the target contains cadmium and sulfur. In another embodiment, the material that is ejected on sputtering from the target in an environment of oxygen may contain cadmium, sulfur and oxygen.

The method further provides a step 20 for depositing a film of the ejected material on to the substrate or superstrate. The film deposited on the substrate or superstrate includes cadmium and sulfur. In one embodiment, the deposited film further includes oxygen, which may be incorporated into the film from oxygen that originated in the target or that originated in the ambient environment. In yet another embodiment, the film includes $CdS_{1-y}O_y$ wherein y varies from about 0.001 to about 0.5. In one embodiment, the deposited film has an oxygen concentration in a range from about 1 atomic percent to about 35 atomic percent. In another embodiment, film has an oxygen concentration in a range from about 1 atomic percent to about 25 atomic percent; and in particular embodiments the film has an oxygen concentration in a range from about 5 atomic percent to about 20 atomic percent. In one embodiment, the concentration of oxygen in the film is uniform within the film. In another embodiment, the film has a gradient of oxygen concentration within the film, meaning that the oxygen concentration in the film varies as a function of film thickness, for example where the concentration varies from a first concentration at one side of the film (i.e. the material deposited early in the process) to a second concentration at the opposite side (i.e. the material deposited later in the process). The variation may be smooth and continuous, or the variation may occur as a series of discreet changes in oxygen concentration. The gradient may be formed, for example, by altering the film deposition parameters, such as the oxygen concentration of the ambient environment, during the course of the deposition step. In one embodiment, the film with a gradient of oxygen concentration has a first oxygen concentration in a range from about 0 atomic percent to about 10 atomic percent. In another embodiment, the film with a gradient of oxygen concentration has a second oxygen concentration in a range from about 20 atomic percent to about 50 atomic percent. In one embodiment, the film may further include zinc.

In one embodiment, the thickness of the film deposited is at least about 10 nanometers. In another embodiment, the thickness of the film is in a range from about 20 nanometers to about 200 nanometers. The deposition of the film may be controlled by balancing a number of parameters, for example pressure, temperature, the energy source used, sputtering power, pulsing parameters, the size and characteristics of the target material, the distance or space between the target and the substrate or superstrate, as well as the orientation and location of the target material within the deposition environment. Selection of the sputtering power is dependent on the substrate size and the desired deposition rate.

In one embodiment of the present invention, the method further includes a step of annealing the film. The annealing of the film may be carried out for a duration of about 1 minute to about 30 minutes. The annealing may be carried out at a temperature in a range of about 100 degrees Celsius to about 550 degrees Celsius. In yet another embodiment, the annealing is carried out at a temperature of about 200 degrees Celsius.

Figure 2:
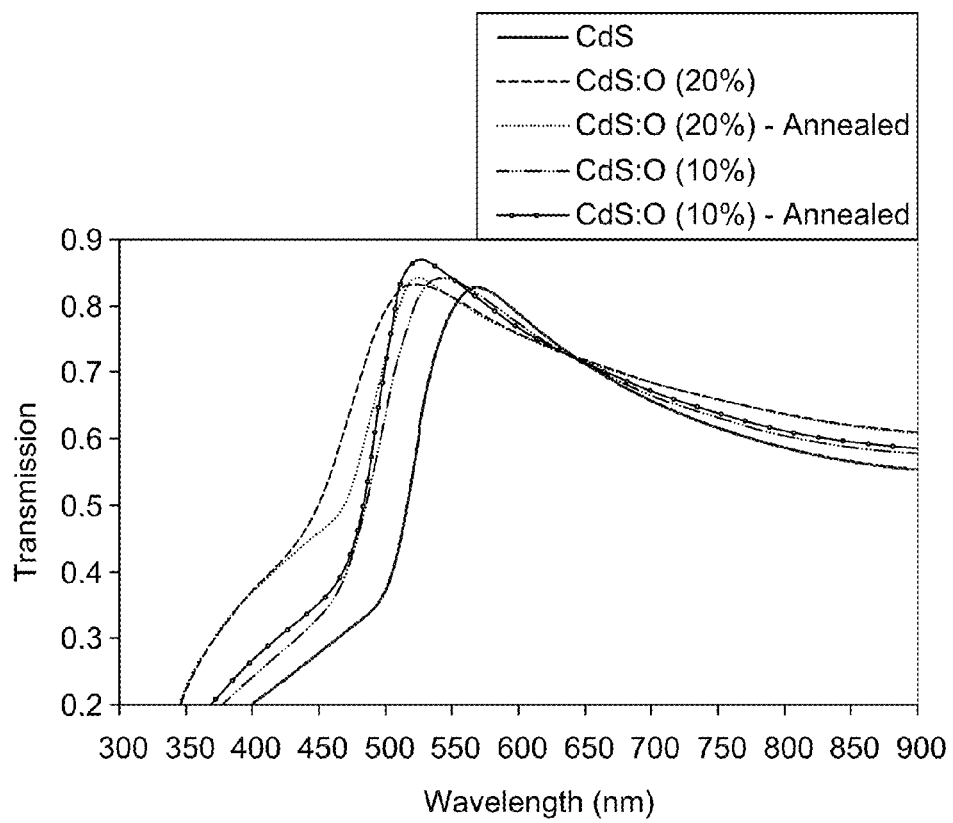
FIG. 2 illustrates a plot of the percentage transmission with respect to the wavelength of a film in accordance to an embodiment of the invention.

In one embodiment, the film is thermally stable at a temperature in a range from about 500 degrees Celsius to about 700 degrees Celsius. As used herein the term "thermally stable" means that when heated to a given temperature, such as about 500 degrees Celsius, for 10 minutes, an optical property of the thermally stable film, such as the integrated area under its transmission curve between wavelengths in the range from about 400 nanometers to about 600 nanometers, does not change by an amount greater than 10 percent with respect to that of the transmission of radiation between 400 nanometers and 600 nanometer for an unheated film (or a baseline). For example the integrated area under the transmission curve for a film before and after exposure to high temperature would not vary by an amount greater than 10 percent for a "thermally stable" film. In one embodiment, optical properties such as refractive index and/or extinction coefficient in a wavelength between 300 nanometers and 900 nanometer do not change by an amount greater than 10% for a thermally stable film. In one embodiment, the film is thermally stable at a temperature in the range from about 500 degrees Celsius to about 700 degrees. In another embodiment, the film comprising cadmium sulfide and oxygen is thermally stable at a temperature in the range from about 500 degrees Celsius to about 600 degrees. In yet another embodiment, the film comprising cadmium sulfide and oxygen is thermally stable at a temperature of about 550 degrees Celsius. As illustrated in FIG. 2, the film has an integrated transmission of at least about 80 percent in a wavelength in a range from about 300 nanometers to about 900 nanometers even when subjected to an annealing temperature of about 500 degrees Celsius for a duration of 10 minutes. Further, as noted from FIG. 2, the film that included cadmium sulfide and oxygen retained a significant fraction of the blue shift in comparison to a cadmium sulfide film after annealing at about 500 degrees Celsius in vacuum about 20 milliTorr for a duration of 10 minutes. It was also noted that the integrated transmission of the film did not change by more than about 6% after heating at 500 degrees Celsius for a period of 10 minutes.

Figure 3:
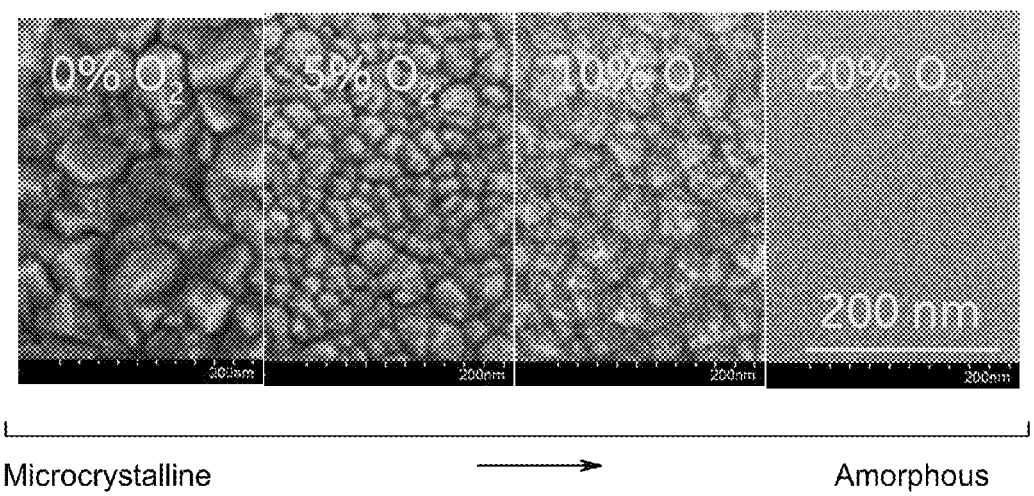
FIG. 3 illustrates the scanning electron micrographs of a film in accordance with an embodiment of the invention.
Figure 4:
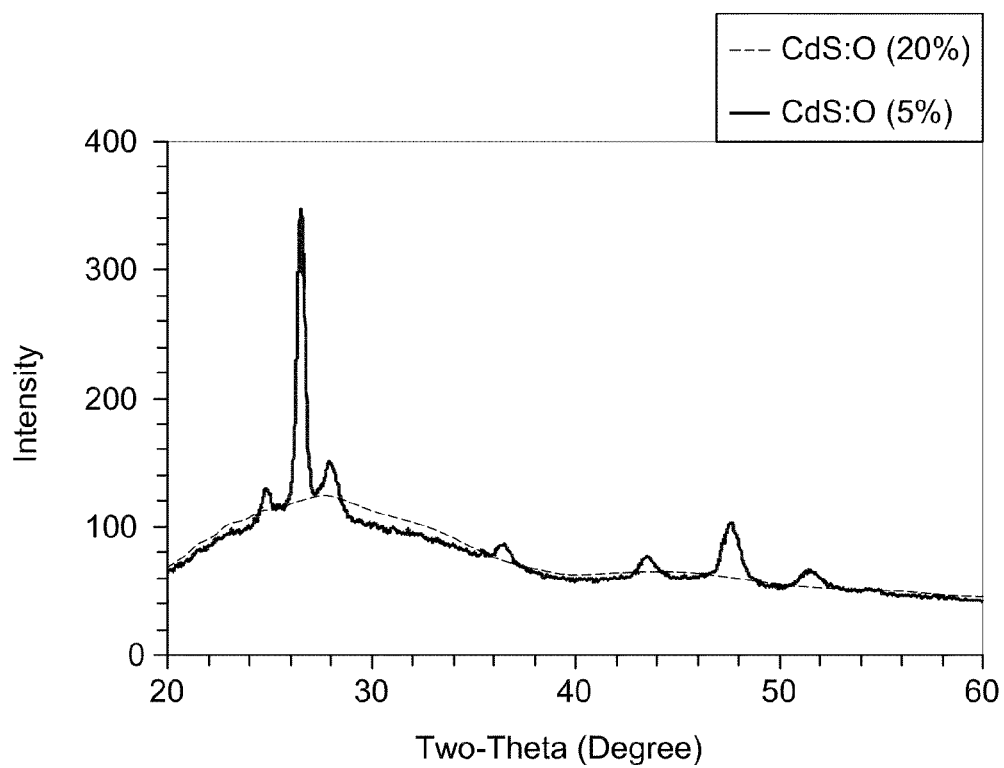
FIG. 4 illustrates the X-ray diffraction of a film in accordance with an embodiment of the invention.

In another embodiment, the film has a band gap in a range from about 2.3 electron Volts to about 3.1 electron Volts. In some embodiments, the film has a band gap in a range from about 2.45 electron Volts to about 2.75 electron Volts. In one embodiment, the film deposited by the present method has a microcrystalline morphology with grain size of less than about 100 nanometers. In one embodiment, the film deposited by the present method has a nanocrystalline morphology. In another embodiment, the film comprises an amorphous morphology. Typically, it may be noted that the morphology of the film changes with the concentration of oxygen present in the film. For example as illustrated in FIG. 3 the morphology of the film changed from a microcrystalline morphology with an oxygen concentration of about 5 atom percent to an amorphous morphology when the oxygen concentration in the film increased to about 20 atom percent. This is further supported by data from an x-ray diffraction study (FIG. 4) where the morphology of the film changed from microcrystalline morphology to an amorphous morphology as the oxygen concentration in the film increased from 5 atom percent to about 20 atom percent.

Figure 5:
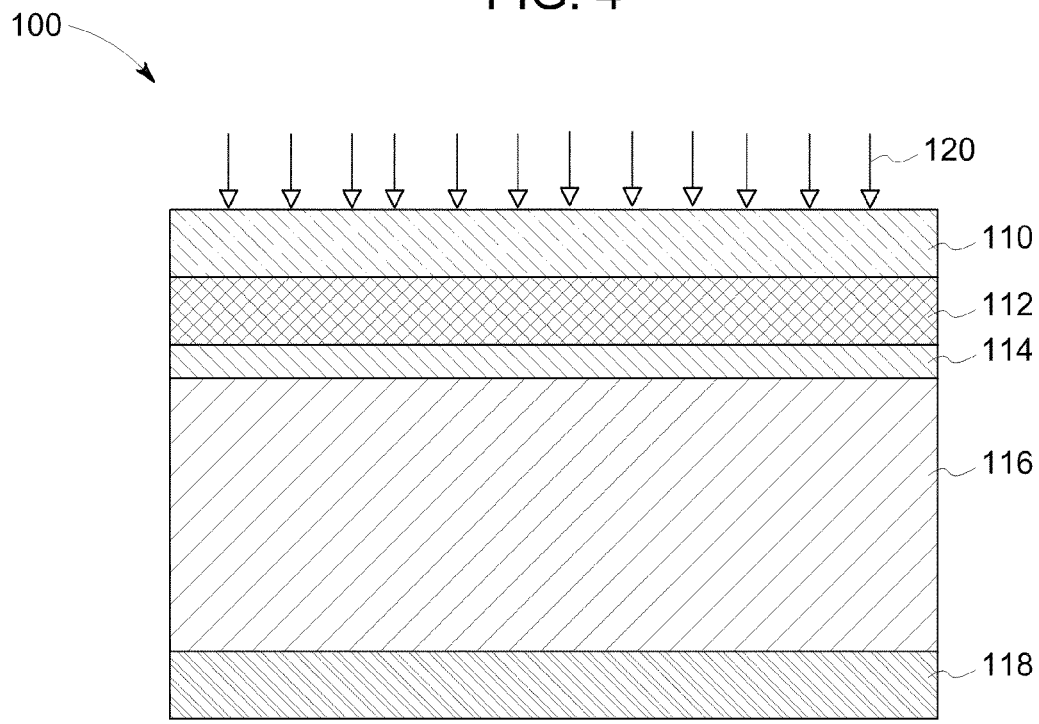
FIG. 5 illustrates a schematic of a photovoltaic device in accordance with an embodiment of the invention.

In another aspect, the present invention provides a device that includes the deposited film as a transparent window layer. As illustrated in FIG. 5, in one embodiment, a photovoltaic device 100 is provided. The device 100 includes a layer, such as one or more layers 110, 112, 114, 116, and 118. In one embodiment, the photovoltaic device 100 includes a substrate 110 and a transparent conductive layer 112 disposed over the substrate 110. In the illustrated embodiment, a transparent window layer 114 is disposed over the transparent conductive layer 112. In one embodiment, the first semiconducting layer 116 is disposed over the transparent window layer 114. The back contact layer 118 is disposed over the first semiconducting layer.

The configuration of the layers illustrated in FIG. 5 may be referred to as a "superstrate" configuration since the light 120 enters from the support or substrate 110 and then passes on into the device. Because, in this embodiment the substrate 110 is in contact with the transparent conductive layer 112, the substrate 110 is generally sufficiently transparent for visible light to pass through the substrate 110 and come in contact with the front contact layer 112. Suitable examples of materials used for the substrate 110 in the illustrated configuration include glass or a polymer. In one embodiment, the polymer comprises a transparent polycarbonate or a polyimide. Generally, the substrate may include substrates of any suitable material, including, but not limited to, metal, semiconductor, doped semiconductor, amorphous dielectrics, crystalline dielectrics, and combinations thereof.

The transparent conductive layer and the back contact layers, during operation, carry electric current out to an external load and back into the device, thus completing an electric circuit. Suitable materials for transparent conductive layer 112 may include an oxide, sulfide, phosphide, telluride, or combinations thereof. These transparent conductive materials may be doped or undoped. In one embodiment, the transparent conductive layer 112 comprises a transparent conductive oxide, examples of which include zinc oxide, tin oxide, cadmium tin oxide ($Cd_2SnO_4$), zinc tin oxide ($ZnSnO_x$), indium tin oxide (ITO), aluminum-doped zinc oxide (ZnO: Al), zinc oxide (ZnO), fluorine-doped tin oxide (SnO:F), titanium dioxide, silicon oxide, gallium indium tin oxide (Ga—In—Sn—O), zinc indium tin oxide (Zn—In—Sn—O), gallium indium oxide (Ga—In—O), zinc indium oxide (Zn—In—O), and combinations of these. Suitable sulfides may include cadmium sulfide, indium sulfide and the like. Suitable phosphides may include indium phosphide, gallium phosphide, and the like.

Typically, when light falls on the solar cell 100, electrons in the first semiconducting layer (also sometimes referred to as "semiconductor absorber layer" or "absorber layer") 116 are excited from a lower energy "ground state", in which they are bound to specific atoms in the solid, to a higher "excited state," in which they can move through the solid. Since most of the energy in sunlight and artificial light is in the visible range of electromagnetic radiation, a solar cell absorber should be efficient in absorbing radiation at those wavelengths. In one embodiment, the first semiconducting layer 116 includes a telluride, a selenide, a sulfide or combinations thereof. In another embodiment, the first semiconducting layer 116 comprises cadmium telluride, cadmium zinc telluride, cadmium sulfur telluride, cadmium manganese telluride, or cadmium magnesium telluride. Cadmium telluride (also sometimes referred to herein as "CdTe") thin film typically has a polycrystalline morphology. Additionally, cadmium telluride is found to have a high absorptivity and a bandgap in a range from about 1.45 electron volts to about 1.5 electron volts. In one embodiment, the electronic and optical properties of cadmium telluride may be varied by forming an alloy of cadmium telluride with other elements or compounds for example, zinc, magnesium, manganese, and the like. Although CdTe is most often used in photovoltaic devices without being alloyed, it can be. Films of CdTe can be manufactured using low-cost techniques. In one embodiment, the CdTe first semiconducting layer 116 may typically comprise p-type grains and n-type grain boundaries.

The cadmium telluride may, in certain embodiments, comprise other elements from Group II and Group VI or Group III and Group V that may not result in large bandgap shifts. In one embodiment, the bandgap shift is less than or equal to about 0.1 electron Volts for the absorber layer. In one embodiment, the first semiconducting layer includes cadmium telluride, cadmium zinc telluride, tellurium-rich cadmium telluride, cadmium sulfur telluride, cadmium manganese telluride, or cadmium magnesium telluride. In one embodiment, the atomic percent of cadmium in the cadmium telluride is in the range from about 48 atomic percent to about 52 atomic percent. In another embodiment, the atomic percent of tellurium in the cadmium telluride is in the range from about 45 atomic percent to about 55 atomic percent. In one embodiment, the cadmium telluride employed may include a tellurium-rich cadmium telluride, such as a material wherein the atomic percent of tellurium in the tellurium-rich cadmium telluride is in the range from about 52 atomic percent to about 55 atomic percent. In one embodiment, the atomic percent of zinc or magnesium in cadmium telluride is less than about 10 atomic percent. In another embodiment, the atomic percent of zinc or magnesium in cadmium telluride is about 8 atomic percent. In yet another embodiment, the atomic percent of zinc or magnesium in cadmium telluride is about 6 atomic percent. In one embodiment, the CdTe absorber layer 116 may comprise p-type grains and n-type grain boundaries.

In one embodiment, the transparent window layer 114 comprises the sulfide layer described previously, above. The transparent window layer 114, disposed on first conductive layer 116, is the junction-forming layer for device 100. The "free" electrons in the first conductive layer 116 are in random motion, and so generally there can be no oriented direct current. The addition of the transparent window layer 114, however, induces a built-in electric field that produces the photovoltaic effect. The transparent window layer 114 includes cadmium sulfide and oxygen, and is thermally stable at a temperature in the range from about 500 degrees Celsius to about 700 degrees. In one embodiment, the transparent window layer 114 may further include zinc telluride, zinc selenide, cadmium selenide, cadmium sulfur oxide, and or copper oxide. In another embodiment, the transparent window layer includes $CdS_{1-y}O_y$, where y varies from 0.01 to 0.5. The atomic percent of cadmium in the cadmium sulfide, in some embodiments, is in range from about 48 atomic percent to about 52 atomic percent. In one embodiment, the atomic percent of sulfur in the cadmium sulfide is in a range from about 45 atomic percent to about 55 atomic percent.

In one embodiment, the transparent window layer comprises oxygen in a range from about 1 atomic percent to about 50 atomic percent. In one embodiment, the transparent window layer 114 has a uniform oxygen concentration within the window layer 114. In another embodiment, the transparent window layer 114 includes a gradient of oxygen concentration within the transparent window layer 114. In one embodiment, the gradient of oxygen concentration has a first oxygen concentration is in a range from about 0 atomic percent to about 10 atomic percent at an interface with the first semiconducting layer 116. In yet another embodiment, the gradient of oxygen concentration has a second oxygen concentration in a range from about 20 atomic percent to about 50 atomic percent at an interface with the transparent conductive layer 112. In one embodiment, the gradient of oxygen concentration decreases within the transparent window layer 114 from the interface of the transparent window layer 114 with the transparent conductive layer 112 to the interface of the transparent window layer 114 with the first semiconducting layer 116. In another embodiment, the transparent window layer 114 may include a bi-layer comprising a layer of cadmium sulfide with oxygen and a second layer comprising cadmium sulfide substantially free of oxygen. In one embodiment, the transparent window bi-layer 114 may be in disposed such that the layer comprising cadmium sulfide and oxygen forms an interface with the transparent conductive layer 112, while the layer comprising the cadmium sulfide forms an interface with the first semiconducting layer 116. In one embodiment, the transparent window layer 114 has a thickness in a range from about 5 nanometers to about 250 nanometers, or in a range from about 20 nanometers to about 200 nanometers. Typically, the first semiconducting layer 116 and the transparent window layer 114 provide a heterojunction interface between the two layers. In some embodiments, the transparent window layer 114 acts as an n-type window layer that forms the pn-junction with the p-type first semiconducting layer.

Typically, the back contact layer 118 transfers current into or out of device 100 depending on the overall system configuration. Generally, back contact layer 118 comprises a metal, a semiconductor, graphite, or other appropriately electrically conductive material. In one embodiment, the back contact layer 118 comprises a semiconductor comprising p-type grains and p-type grain boundaries. The p-type grain boundaries will assist in transporting the charge carriers between the back contact metal and the p-type semi-conductor layer. In some embodiments, the back contact layer may comprise one or more of a semiconductor selected from zinc telluride (ZnTe), mercury telluride (HgTe), cadmium mercury telluride (CdHgTe), arsenic telluride ($As_2Te_3$), antimony telluride ($Sb_2Te_3$), and copper telluride ($Cu_xTe$).

In some embodiments a metal layer (not shown) may be disposed on the back contact layer 118 for improving the electrical contact. In some embodiments, the metal layer includes one or more of group IB metal, or a group IIIA metal, or a combination thereof. Suitable non-limiting examples of group IB metals include copper (Cu), silver (Ag), and gold (Au). Suitable non-limiting examples of group IIIA metals (e.g., the low melting metals) include indium (In), gallium (Ga), and aluminum (Al). Other examples of potentially suitable metals include molybdenum and nickel.

In one embodiment, the device may further include a second semiconducting layer (not shown) disposed on the first semiconducting layer 116. In one embodiment, the second semiconducting layer includes n-type semiconductor. The second semiconducting layer may include an absorber layer that is the part of the photovoltaic device where the conversion of electromagnetic energy of incident light (for instance, sunlight) to electrical energy (that is, to electrical current), occurs. Generally, a first semiconducting layer or the absorber layer 116 may be disposed on the transparent window layer 114 and a second semiconducting layer may be disposed on the first semiconducting layer 116. The first semiconducting layer 116 and the second semiconducting layer may be doped with a p-type doping or n-type doping such as to form a heterojunction. As used herein, the term "heterojunction" is a semiconductor junction, which is composed of layers of dissimilar semiconductor material. These materials usually have non-equal band gaps. As an example, a heterojunction can be formed by contact between a layer or region of one conductivity type with a layer or region of opposite conductivity, e.g., a "p-n" junction. The second semiconducting layer may be selected from bandgap engineered II-VI compound semiconductors, for example, cadmium zinc telluride, cadmium sulfur telluride, cadmium manganese telluride, cadmium mercury telluride, cadmium selenide, or cadmium magnesium telluride. In one embodiment, the second semiconducting layer may include a copper indium gallium diselenide (CIGS). In addition to solar cells, other devices, which utilize the heterojunction, include thin film transistors and bipolar transistors.

In some other embodiments, the device may further include a high resistance transparent layer (not shown). In one embodiment, the high resistance transparent layer may be disposed above the transparent conductive layer. In another embodiment, the high resistance transparent layer may be disposed between the transparent conductive layer 112 and the transparent window layer 114. The high resistant transparent layer may be selected from tin oxide, zinc oxide, zinc tin oxide (Zn—Sn—O), or zinc indium tin oxide (Zn—In—Sn—O). In one embodiment, the device does not include a high resistance transparent layer.

Figure 6:
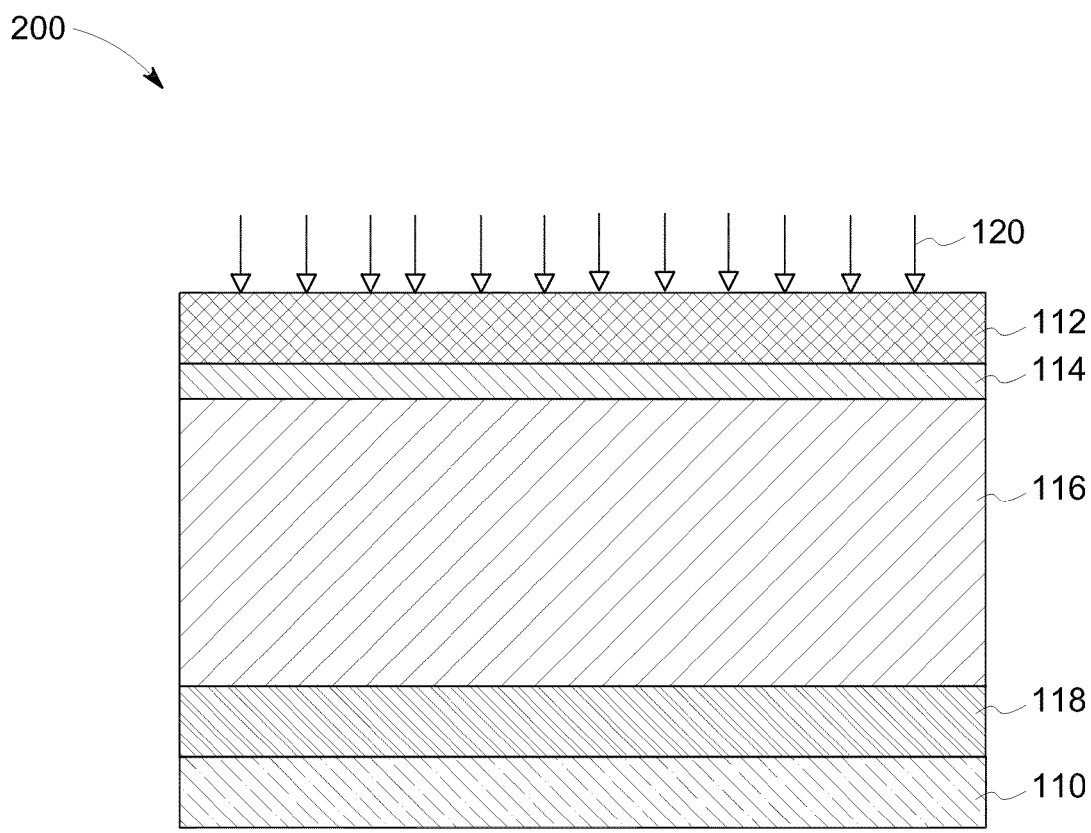
FIG. 6 illustrates a schematic of a photovoltaic device in accordance with another embodiment of the invention.

In an alternative embodiment as illustrated in FIG. 6, a "substrate" configuration comprises a photovoltaic device 200 wherein a back contact layer 118 is disposed on a substrate 110. Further a first semiconducting layer 116 is disposed over the back contact layer 118. A transparent window layer 114, comprising the sulfide layer described previously, is then disposed on the first semiconducting layer 116 and a transparent conductive layer 112 is disposed on the transparent window layer 114. In the substrate configuration, the substrate may comprise glass, polymer, or a metal foil. In one embodiment, metals that may be employed to form the metal foil include stainless steel, molybdenum, titanium, and aluminum. In one embodiment, the composition of the layers illustrated in FIG. 6 i.e. substrate 110, the transparent conductive layer 112, the transparent window layer 114, first semiconducting layer 116, back contact layer 118 have the same compositions as described above in FIG. 5 having the superstrate configuration. In one embodiment, the first semiconducting layer 116 may be selected from copper indium disulfide (CIS), copper indium diselenide (CIS), copper indium gallium diselenide (CIGS), copper indium gallium sulfur selenium (CIGSS), copper indium gallium aluminum sulfur selenium ($Cu(In,Ga,Al)(S,Se)_2$), copper zinc tin sulfide (CZTS) and other CIS-based systems.

Typically, the efficiency of a solar cell is defined as the electrical power that can be extracted from a module divided by the power density of the solar energy incident on the cell surface. Using FIG. 5 as a reference, the incident light 120 passes through the substrate 110, transparent conductive layer 112, and the transparent window layer 114 before it is absorbed in the first semiconducting layer 116, where the conversion of the light energy to electrical energy takes place via the creation of electron-hole pairs. There are four common performance metrics for photovoltaic devices: (1) Short-circuit current density ($J_{SC}$) is the current density at zero applied voltage (2) Open circuit voltage ($V_{OC}$) is the potential between the anode and cathode with no current flowing. At $V_{OC}$ all the electrons and holes recombine within the device. This sets an upper limit for the work that can be extracted from a single electron-hole pair. (3) Fill factor (FF) equals the ratio between the maximum power that can be extracted in operation and the maximum possible for the cell under evaluation based on its $J_{SC}$ and $V_{OC}$. Energy conversion efficiency ($\eta$) depends upon both the optical transmission efficiency and the electrical conversion efficiency of the device, and is defined as:

$$\eta = J_{SC} V_{OC} FF / P_S$$

with (4) $P_S$ being the incident solar power. The relationship shown in the equation does an excellent job of determining the performance of a solar cell. However, the three terms in the numerator are not totally independent factors and typically, specific improvements in the device processing, materials, or design may impact all three factors.

In one embodiment of the present invention the device has a fill factor of greater than about 0.65. In another embodiment, the device has a fill factor in a range from about 0.65 to about 0.85. In yet another embodiment, the device has an open circuit voltage ($V_{OC}$) of greater than about 0.81 volts.

Yet another aspect of the present invention provides a method to make a photovoltaic device. The method includes disposing a transparent conductive layer on a substrate; disposing a transparent window layer on the transparent conductive substrate; and disposing a first semiconducting layer adjacent to the transparent window layer. The step of disposing the transparent window layer is the same as the method for depositing the sulfide layer described previously, and generally includes providing a target comprising a semiconductor material within an environment comprising oxygen, applying a plurality of direct current pulses to the target to create a pulsed direct current plasma, sputtering the target with the pulsed direct current plasma to eject a material comprising cadmium and sulfur into the plasma, and depositing a film comprising the material onto a substrate. The target includes a semiconductor material comprising cadmium and sulfur.

EXAMPLES

Method 1

Preparation of the Film Comprising Cadmium Sulfide and Oxygen

The film comprising cadmium sulfide and oxygen was prepared using a cadmium sulfide target. The cadmium sulfide target was subjected to a bipolar asymmetric DC pulse in a sputtering chamber at frequency of 100 kHz, reverse time of 3.5 μs, and average power density of 1 W/cm². The sputtering chamber was maintained in an environment of oxygen and argon; oxygen to argon flow ratio of 0.05 was employed to produce a film comprising cadmium sulfide and oxygen with approximately 5 atomic percent oxygen in the film During the process, the pressure of the sputtering chamber was maintained at 1.33 Pascals (10 mTorr). Films having varying amount of oxygen present were obtained by changing the flow ratio of argon to oxygen.

A similar method as described above was employed to prepare a film of cadmium sulfide without any oxygen present, the difference being that the environment of the sputtering chamber in this instance was argon without oxygen.

Figure 7:
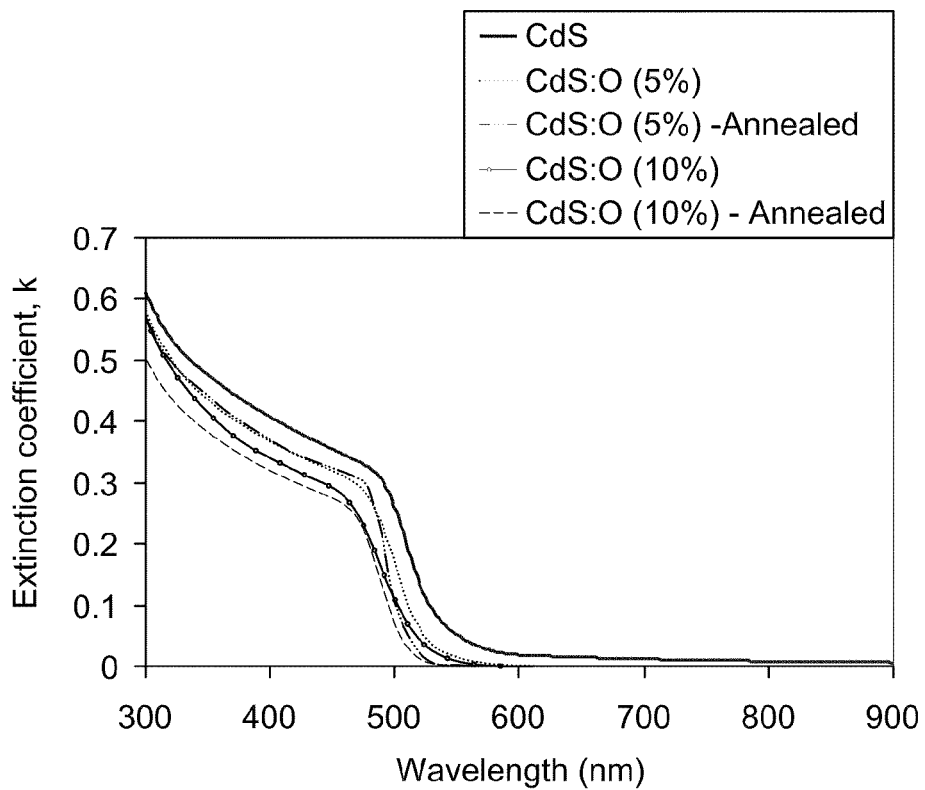
FIG. 7 illustrates a plot of the extinction coefficient with respect to the wavelength of a film in accordance to an embodiment of the invention.
Figure 8:
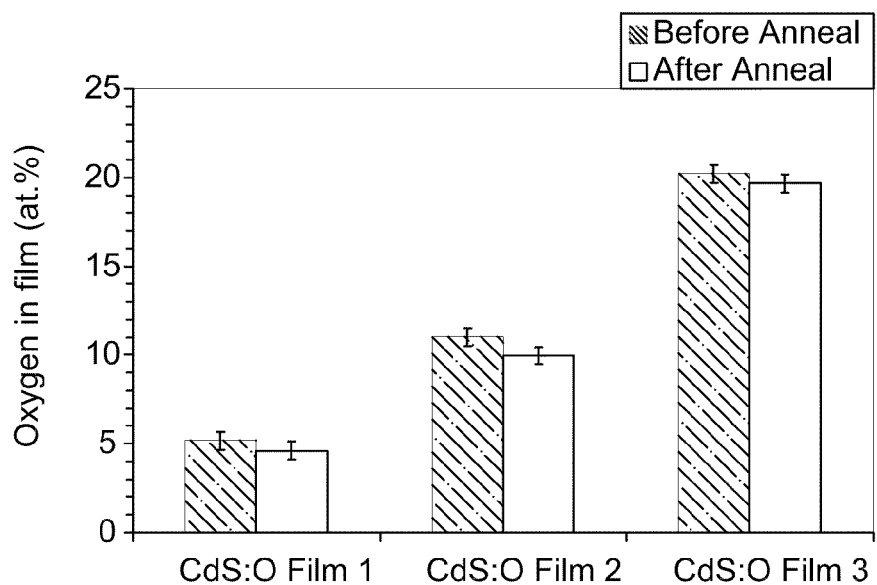
FIG. 8 shows the oxygen content measured by XPS of a film in accordance to an embodiment of the invention.

The films were annealed at a temperature of 500 degrees Celsius for a period of 10 minutes at a pressure of 3 Pascals. As illustrated in FIG. 7., the films containing cadmium sulfide and oxygen were found to be thermally stable as they retained a significant fraction of the blue shift after heating. Thermal stability of the annealed films is also shown in FIG. 8 where the films retained a significant fraction of oxygen even on annealing the film having 5 atom percent and 20 atom percent of oxygen at a temperature of 550 degrees Celsius for a period of 10 minutes. Typically, oxygen would diffuse out of a film which is not thermally stable when exposed to high temperature, thereby leading to a drop in the bandgap of the film.

The films comprising cadmium sulfide and oxygen were deposited on a substrate maintained at a temperature of about 200 degrees Celsius to 250 degrees Celsius. It was observed that the films deposited on the substrate maintained at a temperature of about 200 degrees Celsius to 250 degrees Celsius displayed an increase in the transmission (integrated area between 400 nm to 600 nm) by about 11%, compared to that of a film of cadmium sulfide (without oxygen) film deposited on a substrate maintained at a temperature of about 200 degrees Celsius to 250 degrees Celsius. In sharp contrast, the deposition of a CdS:O film on a substrate maintained at a temperature 250 degrees Celsius employing a RF sputtering technique as described in Mat. Res. Soc. Symp. Proc, Vol. 763, 2003, page B8.9.3-B8.9.4 showed a shift in the absorption edge towards lower energy by about 7% thereby indicating a reduction in the transparency, when compared to that of CdS film.

Method 2

Preparation of the Cadmium Telluride Photovoltaic Device Having A Transparent Window Layer Comprising Cadmium Sulfide and Oxygen A cadmium telluride photovoltaic device was made by depositing about 3 micrometers of cadmium telluride layer over a cadmium sulfide coated $SnO_2$:F TCO glass using a close spaced sublimation process at a temperature of about 500 degrees Celsius. The TCO glass was obtained from Pilkington, and was coated with 3 millimeters of $SnO_2$:F to form a $SnO_2$:F coated soda-lime glass (TEC10 with a built-in high resistance transparent $SnO_2$ layer). The cadmium telluride layer over a cadmium sulfide coated $SnO_2$:F TCO glass was treated with cadmium chloride at a temperature of 400 degrees Celsius for about 20 minutes in air. At the end of the stipulated time, the coated $SnO_2$:F TCO glass was treated with a copper solution and subjected to annealing at a temperature of 200 degrees Celsius for a duration of 18 minutes. Silver was then deposited on the copper treated layer as the back contact by evaporation process.

Devices were prepared employing different materials as the transparent window layer. For example, in comparative example 1 (CEx.1) pulsed-sputtered cadmium sulfide layer (deposited at a temperature of about 200 degrees Celsius to about 250 degrees Celsius) was employed as the transparent window layer; in comparative example 2 (CEx.2) cadmium sulfide deposited using a chemical bath deposition method (CBD) was employed as the transparent window layer; in comparative example 3 (CEx.3) cadmium sulfide deposited at a temperature of about 200 degrees Celsius to about 250 degrees Celsius using RF sputtering was employed as the transparent window layer; and in comparative example 4 (CEx.4) cadmium sulfide with about 10% oxygen deposited at room temperature using RF sputtering was employed as the transparent window layer. In example 1 (Ex. 1) pulsed-sputtered oxygenated cadmium sulfide with 5 atomic % oxygen was employed as the transparent window layer. The thickness of the transparent window layer in all the five devices was maintained at about 80 nanometers.

A photovoltaic device of example 2 (Ex.2) having CdTe/CdS/HRT/$SnO_2$:F device structure was prepared on low-iron soda-lime glass using the method 2 described above. The transparent window layer in example 2, Ex.2 was a pulsed sputtered oxygenated cadmium sulfide with 10 atomic % oxygen having a thickness of 70 nm. The device of Ex.2 included a high resistance transparent oxide layer (HRT) that was a zinc doped $SnO_2$.

A photovoltaic device of example 3 (Ex.3) having CdTe/50 nm CdS+80 nm CdS:O (20%)/$SnO_2$:F device structure was prepared without a high resistance transparent oxide layer using the method 2 described above. The transparent window layer employed in the device of example 3 was a pulsed sputtered oxygenated cadmium sulfide having a gradient of oxygen concentration within the transparent window layer.

TABLE 1

| Type of Transparent Window Layer | Efficiency (%) | Voc (V) | Jsc (mA/m²) | FF |
|---|---|---|---|---|
| Pulsed sputtered cadmium sulfide (CEx.1) | 10.45 | 0.750 | 21.12 | 0.659 |
| Cadmium sulfide (CBD) (CEx.2) | 12.55 | 0.819 | 20.69 | 0.741 |
| RF sputtered cadmium sulfide (CEx.3) | 10.44 | 0.806 | 20.34 | 0.635 |

TABLE 1-continued

| Type of Transparent Window Layer | Effi-ciency (%) | Voc (V) | Jsc (mA/m²) | FF |
|---|---|---|---|---|
| RF sputtered cadmium sulfide + oxygen (10 atomic %) (CEx.4) | 9.67 | 0.795 | 20.72 | 0.587 |
| Pulsed sputtered cadmium sulfide + oxygen (5 atomic %) (Ex.1) | 13.63 | 0.830 | 21.96 | 0.748 |
| HRT + Pulsed sputtered cadmium sulfide + oxygen (10 atomic %) (Ex.2) | 15.3 | 0.84 | 23.76 | 0.767 |
| Pulsed sputtered cadmium sulfide (50 nm) + CdS:O (20 atomic %) (80 nm) (Ex.3) | 10.9 | 0.81 | 19.28 | 0.68 |

It may be noted from Table 1 that the devices with the transparent window layer from Ex.1 displayed an increase in the Jsc and Voc while having a good fill factor (FF) when compared with the performance parameters of devices which had no oxygen present in the transparent window layer as in CEx.1 and CEx.2. It may be noted that a higher oxygen concentration in CdS (Ex.3) is found to have higher efficiency than the device of CEx.1. The device Example 2 (Ex.2) displayed higher Jsc and fill factor while maintaining the high Voc, thus giving higher efficiency, when a 70 nm CdS:O (10 atomic %) layer was used together with a HRT layer.

Comparative examples 3 and 4 (CEx.3 and CEx.4) were devices that had a transparent window layer comprising an RF sputtered cadmium sulfide and an RF sputtered cadmium sulfide+10 atomic % oxygen respectively. As shown in the Table 1, the devices of CEx.3 and CEx.4 were found to have an efficiency of about 10%. While the device of CEx.4 showed an increased Jsc compared to CEx.3, the fill factor was found to have decreased by about 6% to about 7% and the Voc decreased by about 10 milli-Volt, thereby resulting in lower efficiency of the device. As described in Mat. Res. Soc. Symp. Proc, Vol. 763, 2003, page B8.9.1-B8.9.6, a CdS/CdTe device with RF sputtered CdS:O displayed an increase in the Jsc, but the overall device efficiency was found to decrease with a reduction in FF. This may be attributed to a decrease in the junction quality between the transparent window layer and the first semiconducting layer. However, the pulsed sputtered CdS:O films of the present invention showed improved CdTe device performance.

This written description uses examples to disclose some embodiments of the invention, including the best mode, and also to enable any person skilled in the art to practice the invention, including making and using any devices or systems, and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:
1. A device comprising:
   a substrate;
   a first semiconducting layer;
   a transparent conductive layer; and
   a transparent window layer comprising cadmium sulfide and oxygen,
   wherein the device has a fill factor of greater than about 0.65.

2. The device as defined in claim 1, wherein the substrate comprises a glass or a polymer.

3. The device as defined in claim 1, wherein the first semiconducting layer comprises a telluride, a selenide, a sulfide or combinations thereof.

4. The device as defined in claim 1, wherein the first semiconducting layer comprises cadmium telluride, cadmium zinc-telluride, tellurium-rich cadmium telluride, cadmium sulfur telluride, cadmium manganese telluride, cadmium magnesium telluride, mercury cadmium telluride (HgCdTe), or other CdTe-based systems; copper indium disulfide (CIS), copper indium diselenide (CIS), copper indium gallium diselenide (CIGS), copper indium gallium sulfur selenium (CIGSS), copper indium gallium aluminum sulfur selenium (Cu(In,Ga,Al)(S,Se)2), copper zinc tin sulfide (CZTS) or combinations thereof.

5. The device as defined in claim 1, wherein the transparent window layer further comprises, zinc telluride, zinc selenide, cadmium selenide, cadmium sulfur oxide, and or copper oxide.

6. The device as defined in claim 1, wherein the transparent window layer comprises $CdS_{1-y}O_y$ where y varies from 0.01 to 0.5.

7. The device as defined in claim 1, wherein the transparent window layer comprises a gradient of oxygen concentration within the transparent window layer.

8. The device as defined in claim 1, wherein the transparent window layer has a band gap in a range from about 2.3 electron Volts to about 3.1 electron Volts.

9. The device as defined in claim 1, wherein the transparent window layer comprises oxygen in a range from about 0.1 atomic percent to about 50 atomic percent.

10. The device as defined in claim 1, wherein the transparent window layer has a thickness in a range from about 5 nanometers to about 250 nanometers.

11. The device as defined in claim 1, wherein the transparent window layer is thermally stable at a temperature in a range from about 500 degrees Celsius to about 700 degrees Celsius.

12. The device as defined in claim 1, further comprising a high resistance transparent layer is disposed above the transparent conductive layer.

13. The device as defined in claim 1, further comprising a second semiconducting layer comprising a n-type semiconductor disposed on the first semiconducting layer.

14. The device as defined in claim 1, wherein the transparent conductive layer comprises a transparent conductive oxide selected from the group consisting of cadmium tin oxide, zinc tin oxide, indium tin oxide, aluminum-doped zinc oxide, zinc oxide, and/or fluorine-doped tin oxide, and combinations of these.

15. The device of claim 1, further comprising a back contact layer comprising mercury telluride, zinc telluride, cadmium mercury telluride, arsenic telluride, antimony telluride, and copper telluride disposed on the first semiconducting layer.

16. The device as defined in claim 1, wherein the device is a photovoltaic device.

17. A device comprising:
   a superstrate;
   a transparent conductive layer;
   a transparent window layer comprising cadmium sulfide and oxygen;
   a first semiconducting layer comprising a telluride; and
   wherein the device has a fill factor of greater than about 0.65.

18. A device comprising:
a substrate;
a first semiconducting layer comprising a selenide;
a transparent window layer comprising cadmium sulfide and oxygen;
a transparent conductive layer; and
wherein the device has a fill factor of greater than about 0.65.

19. The device as defined in claim 7, wherein the gradient of oxygen concentration has a first oxygen concentration is in a range from about 0 atomic percent to about 10 atomic percent at an interface with the first semiconducting layer.

20. The device as defined in claim 7, wherein the gradient of oxygen concentration has a second oxygen concentration is in a range from about 20 atomic percent to about 50 atomic percent at an interface with the transparent conductive layer.

* * * * *